United States Patent
Wada et al.

(10) Patent No.: US 11,848,677 B2
(45) Date of Patent: Dec. 19, 2023

(54) CLOCK SIGNAL GENERATION CIRCUIT

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Shotaro Wada, Nisshin (JP); Tomohiro Nezuka, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 0 days.

(21) Appl. No.: 17/884,871

(22) Filed: Aug. 10, 2022

(65) Prior Publication Data

US 2023/0126107 A1  Apr. 27, 2023

(30) Foreign Application Priority Data

Oct. 25, 2021 (JP) ................. 2021-173922

(51) Int. Cl.
*H03K 5/00* (2006.01)
*H03K 5/003* (2006.01)
(Continued)

(52) U.S. Cl.
CPC ........ *H03K 5/003* (2013.01); *H03K 5/15013* (2013.01); *H03K 5/15026* (2013.01); *H03K 21/00* (2013.01); *H03K 2005/00013* (2013.01)

(58) Field of Classification Search
CPC ........... H03K 5/15086; H03K 5/15066; H03K 5/1506; H03K 5/15033; H03K 5/15026;
(Continued)

(56) References Cited

U.S. PATENT DOCUMENTS 5,249,214 A * 9/1993 Ulmer ................ H03K 5/15066
377/118
6,020,770 A * 2/2000 Madsen .................. H03M 9/00
327/117

(Continued)

OTHER PUBLICATIONS

L. Xu, J. H. Huijsing and K. A. A. Makinwa, "A ±4-A High-Side Current Sensor With 0.9% Gain Error From −40° C. to 85° C. Using an Analog Temperature Compensation Technique," in IEEE Journal of Solid-State Circuits, vol. 53, No. 12, pp. 3368-3376, Dec. 2018.

*Primary Examiner* — Tuan T Lam
(74) *Attorney, Agent, or Firm* — POSZ LAW GROUP, PLC (57) ABSTRACT

A clock signal generation circuit for a switched capacitor circuit with a chopping function unit includes: first and second synchronous clock circuits that generate first and second synchronous clock signals, respectively; an edge signal generation circuit that generates one or more rise and fall edge signals by delaying the first synchronous clock signal; a first clock generator that generate a first clock signal group for driving the switched capacitor circuit; and a second clock generator that generates a second clock signal group for driving the chopping function unit. Frequencies of the first and second clock signal groups are respectively defined by the first and second synchronous clock circuits. Rise and fall edges of the first and second clock signal groups are defined by the edge signal generation circuit.

14 Claims, 9 Drawing Sheets

(51) Int. Cl.
*H03K 21/00* (2006.01)
*H03K 5/15* (2006.01)

(58) Field of Classification Search
CPC .... H03K 5/15013; H03K 5/003; H03K 21/00; H03K 2005/00013
See application file for complete search history.

(56) References Cited

U.S. PATENT DOCUMENTS

| | | | | |
|---|---|---|---|---|
| 8,604,861 | B1* | 12/2013 | Ceballos | G06G 7/18 |
| | | | | 327/337 |
| 9,473,074 | B1* | 10/2016 | Blom | H03F 3/45192 |
| 10,193,539 | B1* | 1/2019 | Choi | H03K 21/10 |
| 2003/0020529 | A1* | 1/2003 | Nakanishi | H03K 5/1506 |
| | | | | 327/295 |
| 2013/0293294 | A1* | 11/2013 | Lyden | H03G 3/008 |
| | | | | 330/69 |
| 2019/0207573 | A1* | 7/2019 | Stanescu | H03K 19/017509 |
| 2019/0363731 | A1 | 11/2019 | Nezuka | |
| 2019/0379369 | A1* | 12/2019 | Seo | H03K 5/19 |
| 2021/0111726 | A1* | 4/2021 | Jang | G05F 1/59 |
| 2022/0294429 | A1* | 9/2022 | Coban | H03K 3/037 |

* cited by examiner

CLOCK SIGNAL GENERATION CIRCUIT

CROSS REFERENCE TO RELATED APPLICATIONS

The present application claims the benefit of priority from Japanese Patent Application No. 2021-173922 filed on Oct. 25, 2021. The entire disclosure of the above application is incorporated herein by reference.

TECHNICAL FIELD

The present disclosure relates to a circuit that generates a clock signal to be supplied to a switched capacitor circuit having a function of chopping a signal.

BACKGROUND

Figure 10:
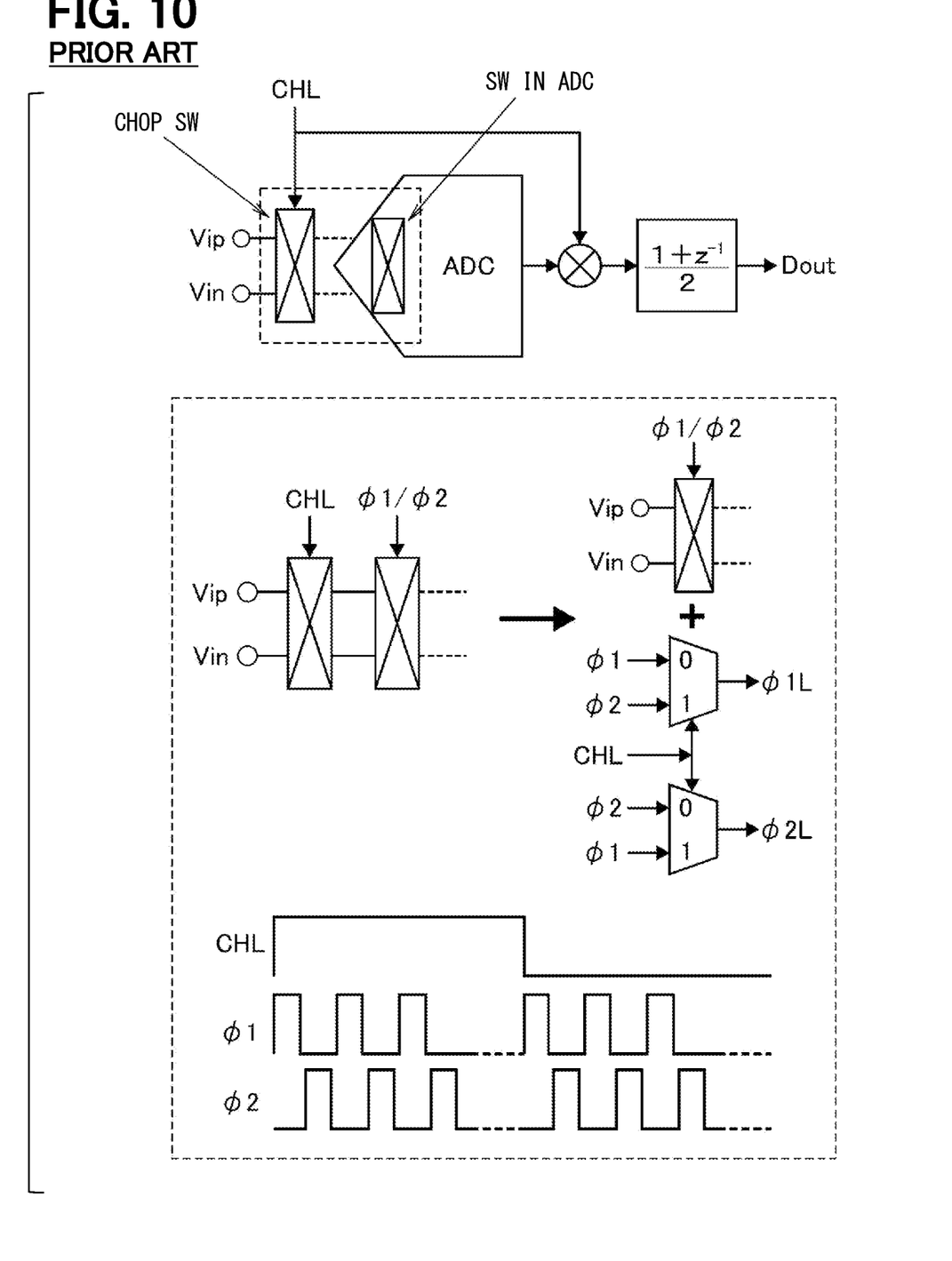
FIG. 10 is a diagram showing a conceivable technique.

For example, Non-Patent Literature 1 teaches a configuration in which a ΔΣ type A/D converter using a switched capacitor circuit provides to chop a signal in order to reduce an offset voltage, as shown in FIG. 10. Since there is also a switch inside the A/D converter, by merging the timing signal to turn on/off the internal switch and the timing signal to turn on/off the chopping switch, the internal switch and the chopping switch can be merged.

PRIOR ART LITERATURE

Non-Patent Literature

[Non-Patent Literature 1] L. Xu, J. H. Huijsing and K. A. A. Makinwa, "A ±4-A High-Side Current Sensor With 0.9% Gain Error From −40° C. to 85° C. Using an Analog Temperature Compensation Technique," in IEEE Journal of Solid-State Circuits, Vol. 53, No. 12, PP. 3368-3376, December 2018.

SUMMARY

According to an example, a clock signal generation circuit for a switched capacitor circuit with a chopping function unit may include: first and second synchronous clock circuits that generate first and second synchronous clock signals, respectively; an edge signal generation circuit that generates one or more rise and fall edge signals by delaying the first synchronous clock signal; a first clock generator that generate a first clock signal group for driving the switched capacitor circuit; and a second clock generator that generates a second clock signal group for driving the chopping function unit. Frequencies of the first and second clock signal groups are respectively defined by the first and second synchronous clock circuits. Rise and fall edges of the first and second clock signal groups are defined by the edge signal generation circuit.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

In the configuration in Non-Patent Literature 1, since each signal is not created from the circuit that generates the same edge, the ON/OFF timing in the switched capacitor and the ON/OFF timing of the chopping signal may be different, so that there is a possibility that the order of the ON/OFF timings of both is not secured. When the delta-sigma type A/D converter is configured, if the ON/OFF timings of both are different from each other, the output error of the A/D converter may be affected.

The present embodiments have been made in view of the above circumstances, and an object thereof is to provide a clock signal generation circuit capable of generating a clock signal for a switched capacitor signal and a chopping signal so as to secure the order of ON/OFF timings of both.

According to the clock signal generation circuit according to a first aspect, the first and second synchronous clock circuits generate first and second synchronous clock signals in which the first and second operation frequency signals are synchronized by the master clock, respectively. The edge signal generation circuit generates one or more rise and fall edge signals by delaying the first synchronous clock signal. The frequency of the first clock signal group generated by the first clock generator is defined by the first synchronous clock circuit, and the rise and fall edges of the first clock signal group are defined by the edge signal generation circuit. Further, the frequency of the second clock signal group generated by the second clock generator is defined by the second synchronous clock circuit, and the rise and fall edges of the second clock signal group are defined by the edge signal generation circuit.

With this configuration, the frequencies of the first clock signal group for mainly driving the switched capacitor circuit and the frequencies of the second clock signal group for driving the chopping function unit are independently defined by the first and second synchronous clock circuits, respectively. Thus, each frequency can be set flexibly. Since the rise and fall edges of the first and second clock signal groups are both defined by the edge signal generation circuit, the edge timings of both signal groups can be synchronized with the rise and fall edge signals.

Further, the clock signal generation circuit according to a second aspect is almost the same as the clock signal generation circuit according to a first aspect except for a feature such that the edge signal generation circuit generates one or more rise and fall edge signals by delaying the second synchronous clock signal. Therefore, the same effect as that of the first aspect can be obtained.

First Embodiment

Figure 1:
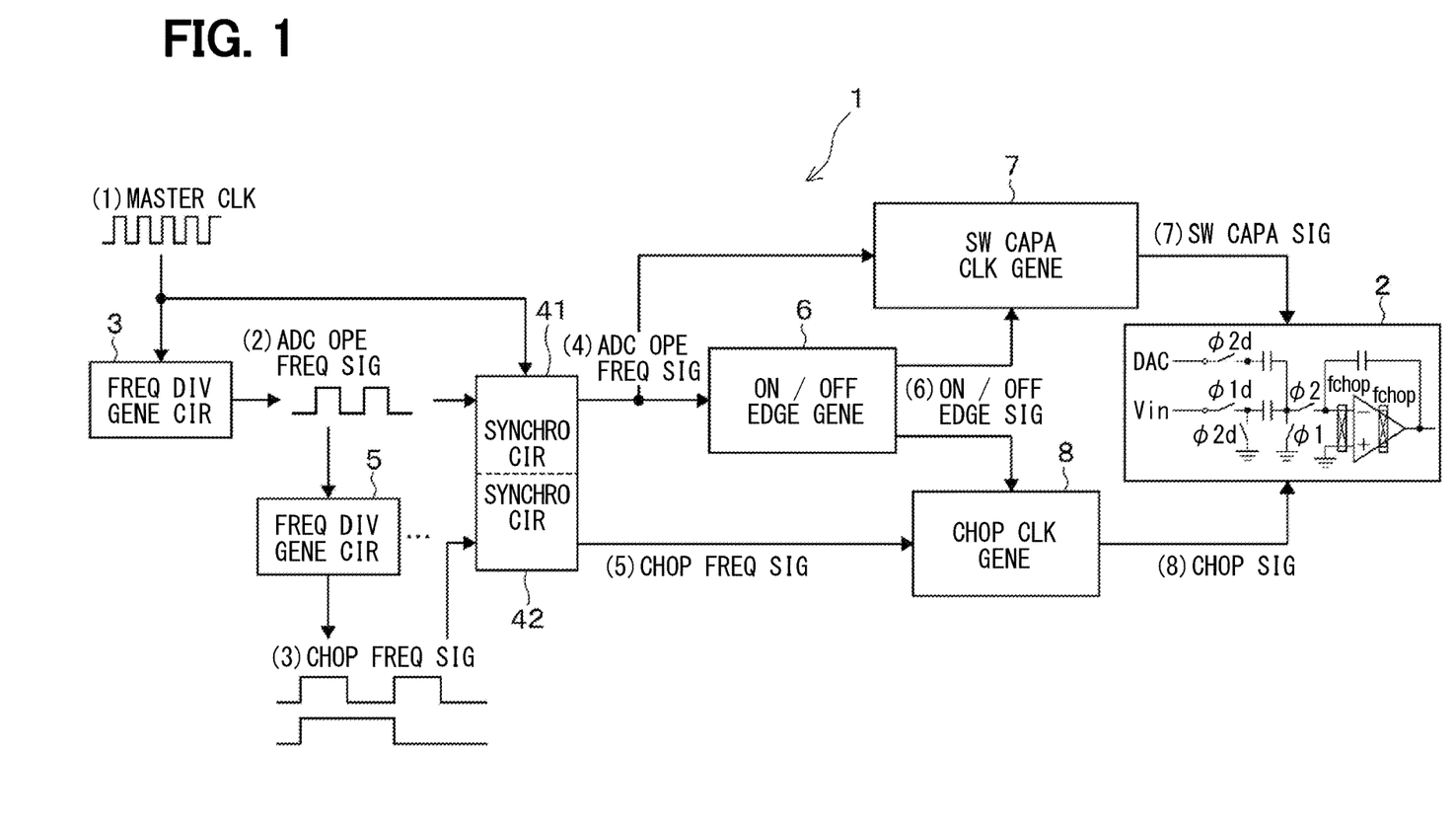
FIG. 1 is a functional block diagram showing a configuration of a switched capacitor system in the first embodiment.
Figure 2:
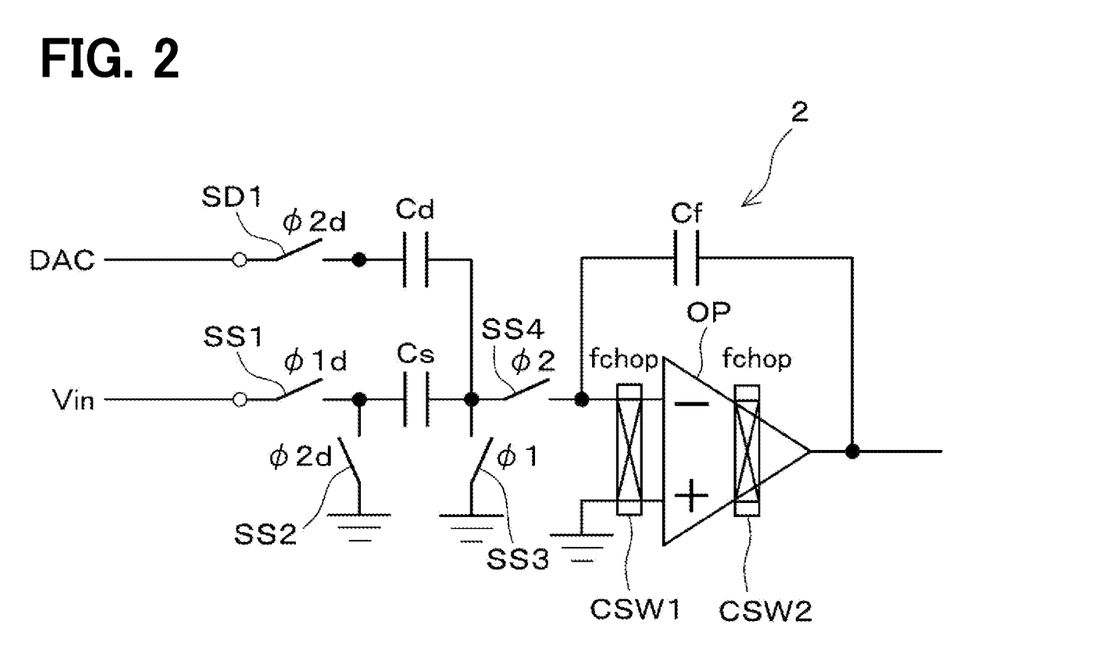
FIG. 2 is a diagram showing a switched capacitor circuit.

As shown in FIGS. 1 and 2, the switched capacitor system 1 of the present embodiment has a configuration in which a clock signal for driving each unit is generated and supplied to the switched capacitor circuit 2 provided with a chopping function unit. The switched capacitor circuit 2 is adopted, for example, to form a ΔΣ A/D converter. Details of the operation of the ΔΣ A/D converter are described in, for example, Japanese Patent No. 6753330.

The output terminal of the operational amplifier OP constituting the switched capacitor circuit 2 is connected to the inversion input terminal of the operational amplifier OP via the integration capacitor Cf. A non-inversion input terminal of the operational amplifier OP is connected to the ground. One end of the sampling capacitor Cs is connected to the input terminal of the analog signal Vin via the switch SS1 and is connected to the ground via the switch SS2. The other end of the sampling capacitor Cs is connected to the ground via the switch SS3 and is connected to the inversion input terminal of the operational amplifier OP via the switch SS4.

The DAC indicates a reference voltage for operating as a D/A converter. The DAC is applied to one end of the DAC capacitor Cd via the switch SD1, and the other end of the DAC capacitor Cd is connected to a common connection point between the sampling capacitor Cs and the switch SS4. The chopping switch CSW1 which is a chopping function unit is arranged on the input terminal side of the operational amplifier OP, and the chopping switch CSW2 is arranged on the output terminal side of the operational amplifier OP.

The master clock signal is input to the first frequency division generation circuit 3 and the synchronous circuit 4. The clock signal of which the frequency thereof is divided by the first frequency division generation circuit 3 becomes a clock signal having a frequency required for the operation of the ΔΣ A/D converter in the switched capacitor circuit 2 (see (1) and (2) in FIG. 3). Hereinafter, the operation of the A/D converter is referred to as "ADC operation". Further, a clock signal having a frequency required for the ADC operation is referred to as an ADC operation frequency signal. The ADC operation frequency signal is the first operation frequency signal.

The ADC operation frequency signal is input to the synchronous circuit 4 and the second frequency division generation circuit 5. The clock signal of which the frequency thereof is divided by the second frequency division generation circuit 5 becomes a clock signal having a frequency required for the chopping operation in the switched capacitor circuit 2 (see (3) in FIG. 3). This clock signal is referred to as a chopping frequency signal. The chopping frequency signal is also input to the synchronous circuit 4. The chopping frequency signal is a second operation frequency signal.

Figure 3:
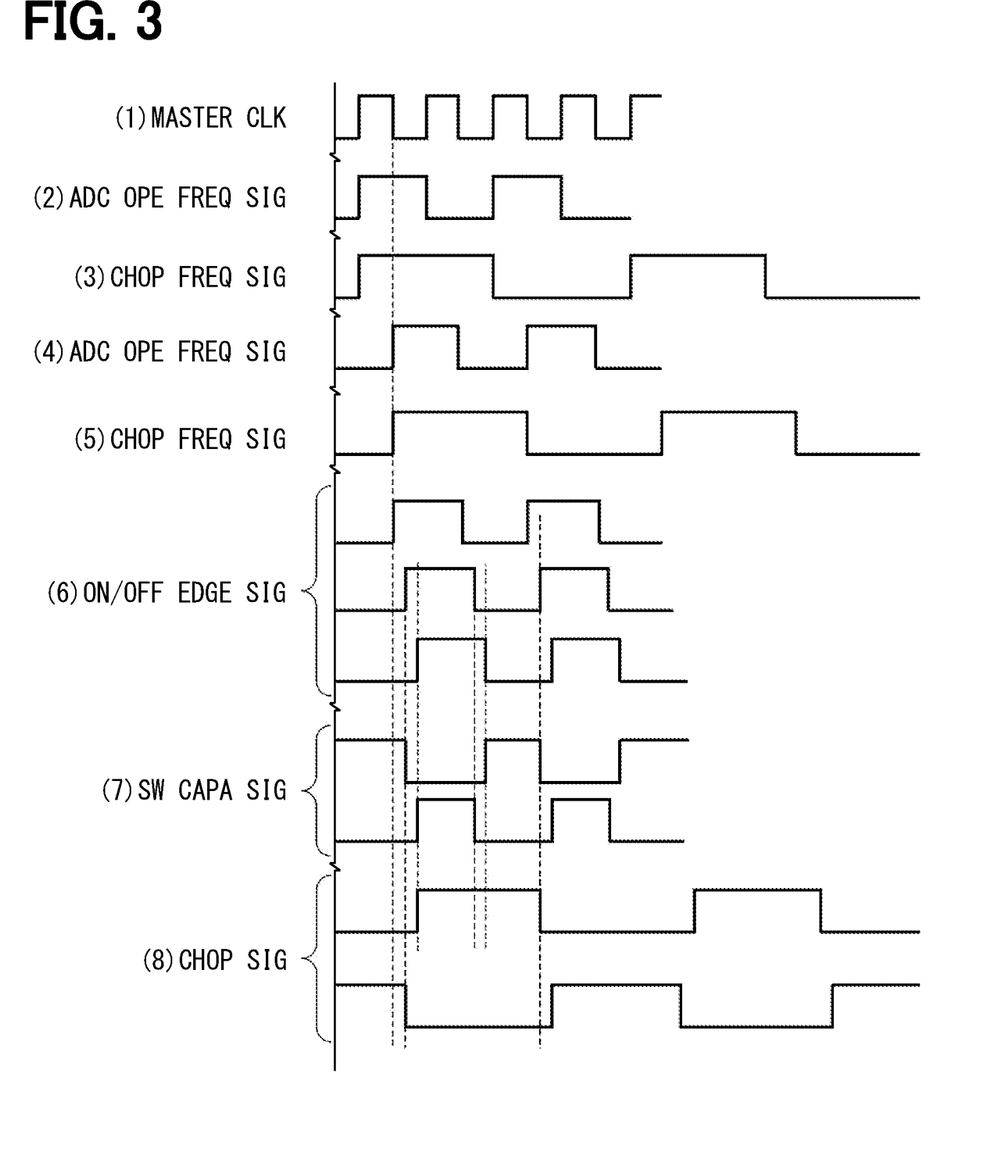
FIG. 3 is a timing chart showing signal waveforms of each part.

The synchronous circuit 4 outputs the ADC operation frequency signal and the chopping frequency signal in synchronization with the master clock signal, respectively (see (4) and (5) in FIG. 3). The synchronized ADC operation frequency signal is input to the ON/OFF edge generator 6 and the switched capacitor clock generator 7, and the synchronized chopping frequency signal is input to the chopping clock generator 8.

The synchronous circuit 4 is actually divided into two parts, and the one part that synchronizes the ADC operation frequency signal is provided by the first clock synchronous circuit 41, and the other part that synchronizes the chopping frequency signal is provided by the second clock synchronous circuit 42. The ADC operation frequency signal synchronized with the master clock signal is the first synchronous clock signal, and the chopping frequency signal synchronized with the master clock signal is the second synchronous clock signal.

The ON/OFF edge generator 6, which is an edge signal generation circuit, outputs the input ADC operation frequency signal as it is, and outputs an ON/OFF edge signal (see (6) in FIG. 3), which is obtained by delaying the input ADC operation frequency signal stepwisely, to the switched capacitor clock generator 7 and the chopping clock generator 8 which are the first clock generator and the second clock generator, respectively. In these clock generators 7 and 8, a signal for operating the switched capacitor circuit 2 and a signal for operating the chopping function unit are generated, respectively (see (7) and (8) in FIG. 3), and supplied to the switched capacitor circuit 2.

Figure 4:
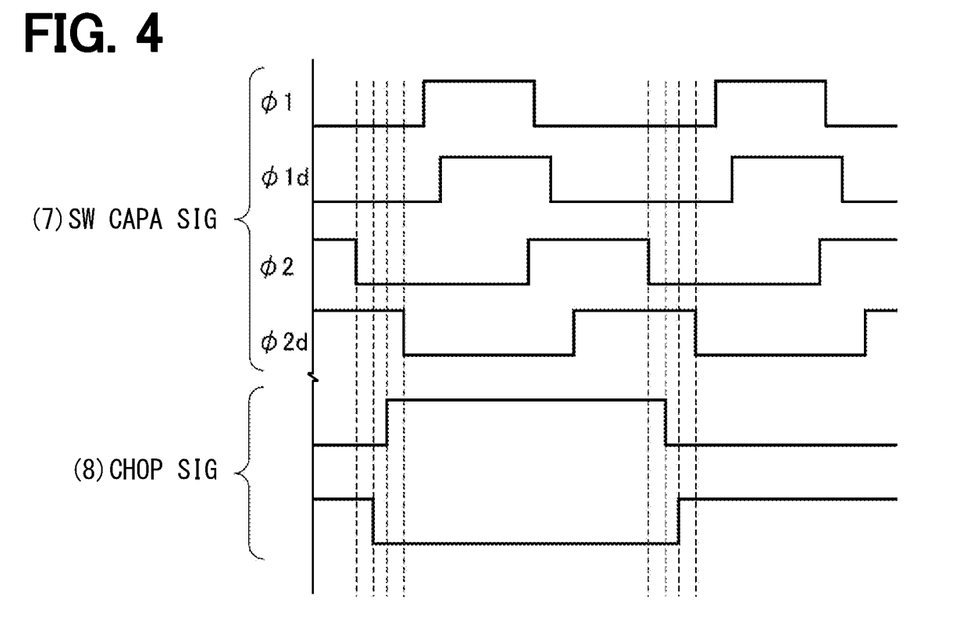
FIG. 4 is a timing chart showing waveforms of ON/OFF control signals of each switch supplied to the switched capacitor circuit.

Φ1, Φ1d, Φ2, and Φ2d of the switched capacitor signal (7) shown in FIG. 4 are signals for controlling the on state and the off state of the switches SS3, SS1, SS4, and SD1, respectively, and correspond to the first clock signal group. Further, the chopping signal (8) shown in the figure is a signal for controlling the on state and the off state of the chopping switches CSW1 and CSW2, and corresponds to a second clock signal group.

As described above, according to the present embodiment, in the switched capacitor system 1, the first synchronous clock circuit 41 and the second synchronous clock circuit 42 respectively generate the clock signals which are obtained by synchronizing the ADC operation frequency signal and the chopping frequency signal with the master clock, respectively. The ON/OFF edge generator 6 generates a plurality of rise and fall edge signals by delaying the ADC operation frequency signal. The frequency of the switched capacitor signal generated by the switched capacitor clock generator 7 is defined by the first synchronous clock circuit 41, and the rise and fall edges thereof are defined by the ON/OFF edge generator 6. Further, the frequency of the chopping signal generated by the chopping clock generator 8 is defined by the second synchronous clock circuit 42, and the rise and fall edges thereof are defined by the ON/OFF edge generator 6.

With this configuration, the frequency of the switched capacitor signal for driving the switched capacitor circuit 2 and the frequency of the chopping signal for driving the chopping switches CSW1 and CSW2 are separately defined by the first and second synchronous clock circuits, respectively, so that each frequency can be set flexibly. Since the rise edges and the fall edges of the switched capacitor signal and the chopping signal are both defined by the ON/OFF edge generator 6, the edge timings of both signals are synchronized with the rise and fall edge signals.

Then, by synchronizing the edge timings of both signals as described above, the order of ON/OFF timings of the switched capacitor signal and the chopping signal becomes as designed, so that the A/D conversion operation is performed correctly.

Second Embodiment

Figure 5:
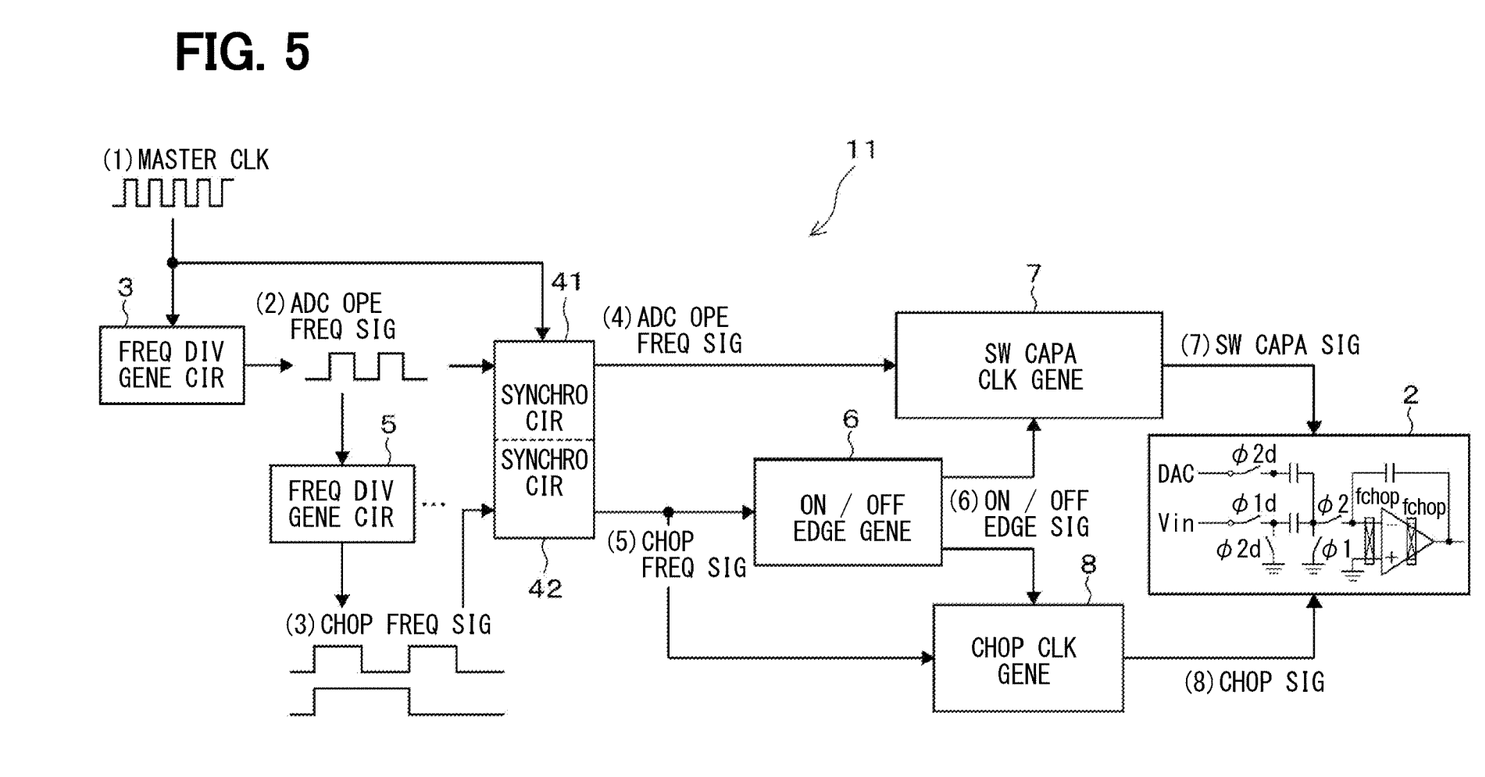
FIG. 5 is a functional block diagram showing a configuration of a switched capacitor system in a second embodiment.

Hereinafter, the identical parts as those in the first embodiment will be designated by the same reference numerals for simplification of the description. Only differences from the first embodiment will be described below. In the switched capacitor system 11 of the second embodiment shown in FIG. 5, the arrangement of the ON/OFF edge generator 6 between the synchronous circuit 4 and the clock generators 7 and 8 is different from that of the switched capacitor system 1. That is, the ADC operation frequency signal synchronized in the synchronous circuit 41 is directly input to the switched capacitor clock generator 7. The chopping frequency signal synchronized in the synchronous circuit 42 is input to the ON/OFF edge generator 6 and the chopping clock generator 8.

Figure 6:
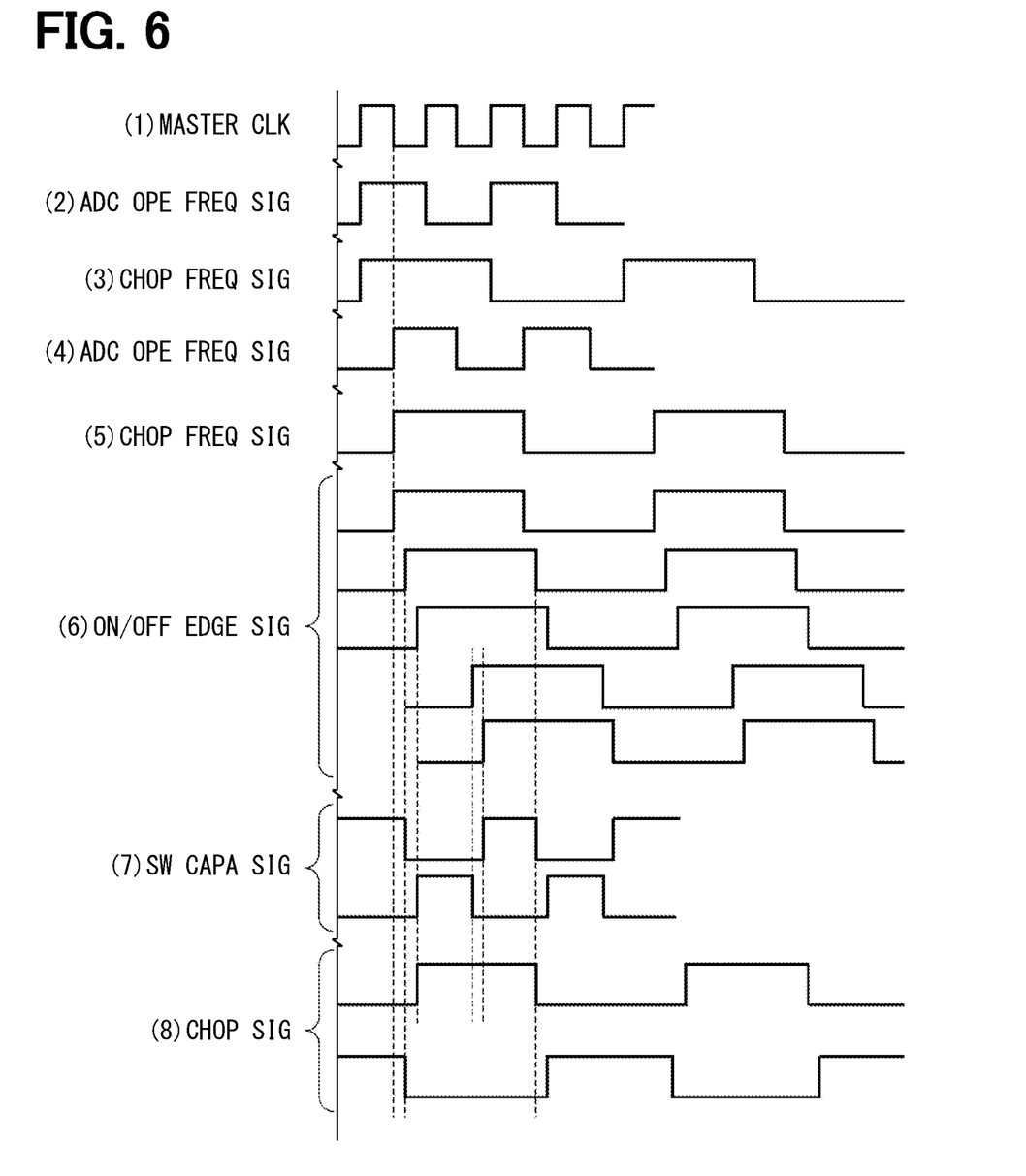
FIG. 6 is a timing chart showing signal waveforms of each part.

As a result, as shown in FIG. 6, the ON/OFF edge signal (6) output by the ON/OFF edge generator 6 provides a chopping frequency signal and a signal obtained by gradually delaying the chopping frequency signal. According to the second embodiment configured as described above, the same effects as those of the first embodiment can be provided.

Third Embodiment

Figure 7:
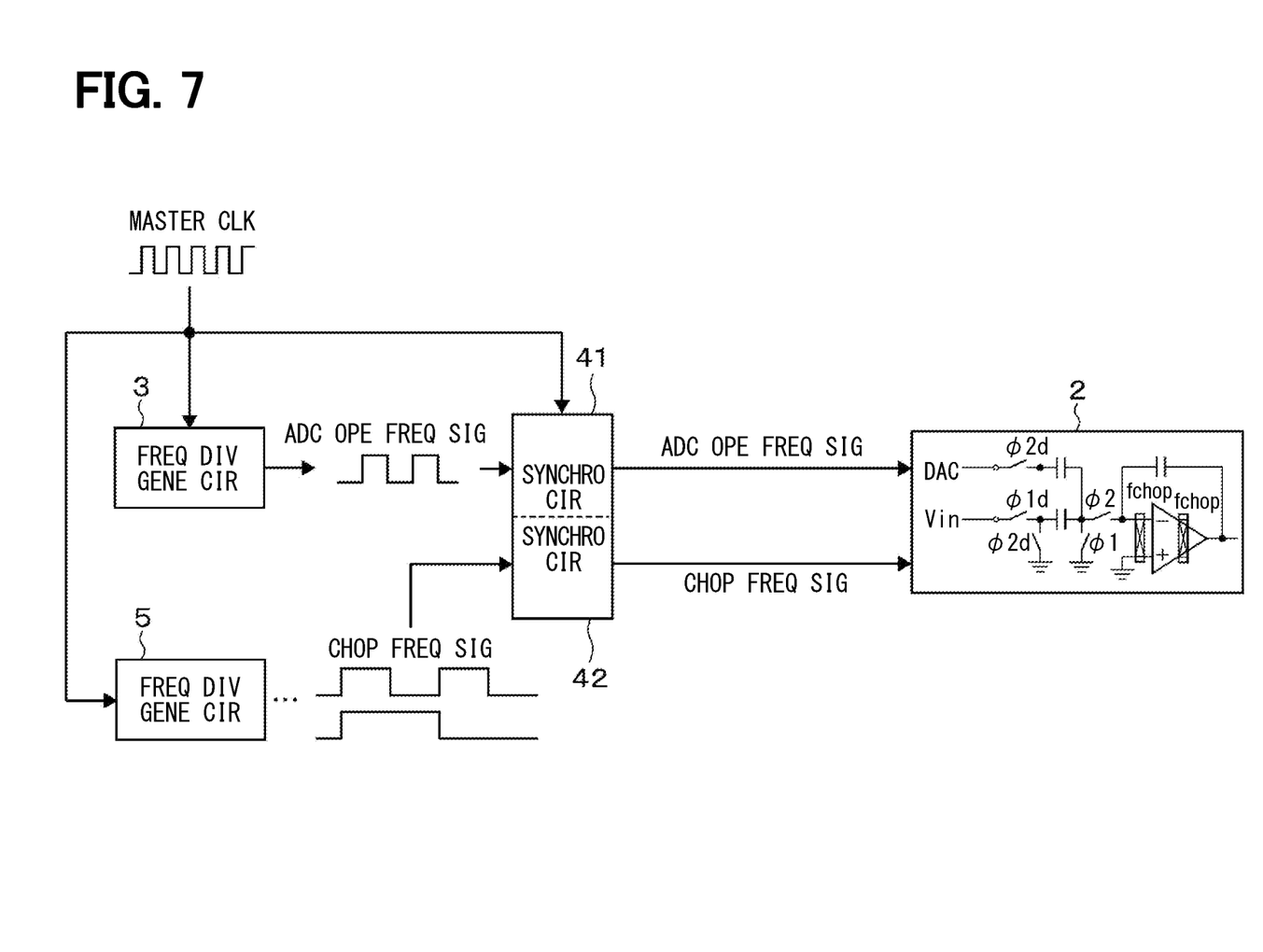
FIG. 7 is a functional block diagram showing a part of the configuration of a switched capacitor system in the third embodiment.

In the first embodiment, based on the ADC operation frequency signal, the second frequency division generation circuit 5 generates the chopping frequency signal by dividing the frequency of the ADC operation frequency signal. In the third embodiment, as shown in FIG. 7, the second frequency division generation circuit 5 generates the chopping frequency signal by dividing the frequency of the master clock signal.

Fourth Embodiment

Figure 8:
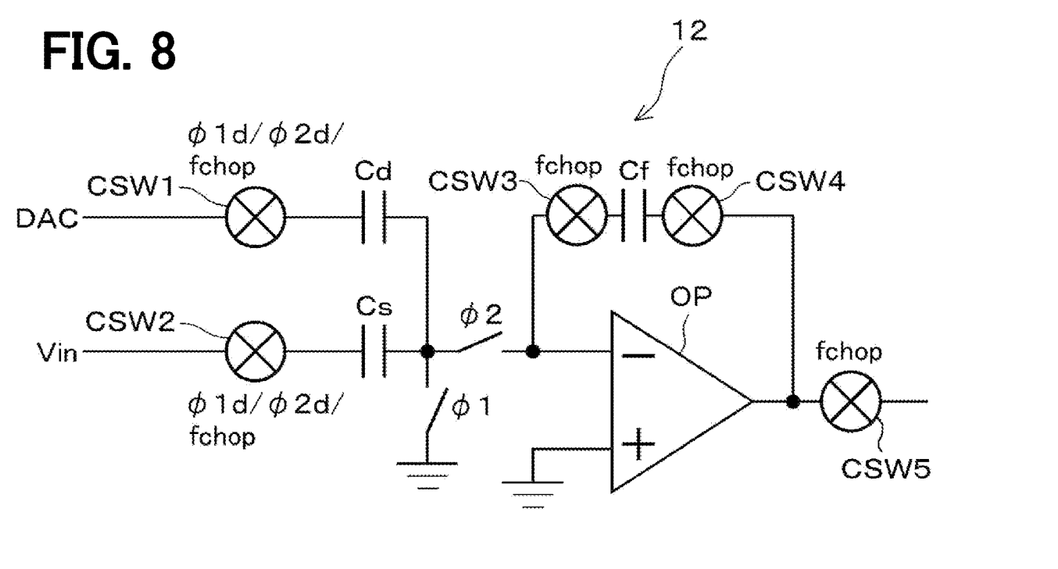
FIG. 8 is a diagram showing a fourth embodiment, which is a variation of the arrangement of the chopping function unit.

The fourth embodiment shows a variation in the arrangement of the chopping function unit in the switched capacitor circuit. In the switched capacitor system 12 shown in FIG. 8, the chopping switch CSW1 is arranged between the DAC and the DAC capacitor Cd, and the chopping switch CSW2 is arranged between the input voltage Vin and the sampling capacitor Cs. Further, the chopping switches CSW3 and CSW4 are arranged at both ends of the integrated capacitor Cf, and the chopping switch CSW5 is arranged at the output terminal of the operational amplifier OP.

Fifth Embodiment

Figure 9:
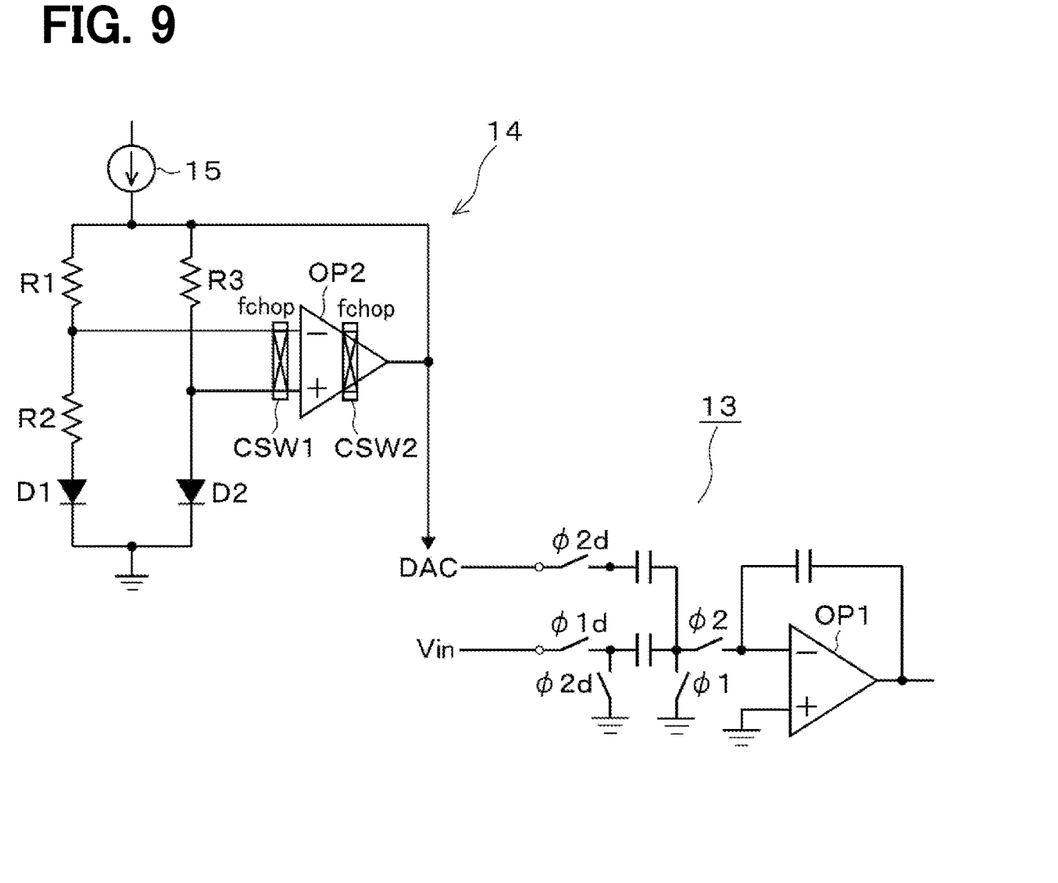
FIG. 9 is a diagram showing a fifth embodiment, which is a variation of the arrangement of the chopping function unit.

Similar to the fourth embodiment, the fifth embodiment shown in FIG. 9 also shows variations in the arrangement of the chopping function unit. In the switched capacitor system 13 of the fifth embodiment, the reference voltage DAC is generated by the bandgap reference voltage circuit 14. A series circuit of a current source 15, resistance elements R1 and R2, and a diode D1 is connected between the power supply and the ground. Further, a series circuit of the resistance element R3 and the diode D2 is connected in parallel to the series circuit the current source 15, the resistance elements R1 and R2, and the diode D1.

Here, the operational amplifier constituting the switched capacitor circuit 2 is defined as OP1, and the operational amplifier used in the reference voltage circuit 14 is defined as OP2. The common connection point of the resistance elements R1 and R2 is connected to the inversion input terminal of the operational amplifier OP2, and the anode of the diode D2 is connected to the non-inversion input terminal of the operational amplifier OP2. The output terminal of the operational amplifier OP2 is connected to the common connection point of the resistance elements R1 and R3, and provides a terminal for supplying the reference voltage DAC. The chopping switches CSW1 and CSW2 are arranged on the input terminal side and the output terminal side of the operational amplifier OP2, respectively, instead of the operational amplifier OP1.

Other Embodiments

The switched capacitor circuit may not be limited to that constituting the $\Delta\Sigma$ A/D converter.

The rise and fall edge signals generated by the edge signal generation circuit may be one or more each.

The chopping frequency signal may not be limited to a signal obtained by dividing the frequency of the ADC operation frequency signal into two parts.

An external clock signal may be used instead of the master clock signal.

Although the present disclosure has been described in accordance with the embodiments, it is understood that the present disclosure is not limited to the above embodiments or structures. The present disclosure incorporates various modifications and variations within the scope of equivalents. In addition, various combinations and forms, and further, other combinations and forms including only one element, or more or less than these elements are also within the sprit and the scope of the present disclosure.

In the drawing, reference numeral 1 is a switched capacitor system, reference numeral 2 is a switched capacitor circuit, reference numeral 3 is a first frequency division generation circuit, reference numeral 41 is a first clock synchronous circuit, reference numeral 42 is a second clock synchronous circuit, and reference numeral 5 is a second frequency division generation circuit, reference numeral 6 is an ON/OFF edge generator, reference numeral 7 is a switched capacitor clock generator, reference numeral 8 is a chopping clock generator, and reference numerals CSW1 and CSW2 are chopping switches.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A clock signal generation circuit that generates a clock signal for driving each unit with respect to a switched capacitor circuit having a chopping function unit for chopping a signal, the clock signal generation circuit comprising:
   a first synchronous clock circuit that generates a first synchronous clock signal in which a first operation frequency signal is synchronized with a master clock;
   a second synchronous clock circuit that generates a second synchronous clock signal in which a second operation frequency signal is synchronized with the master clock;
   an edge signal generation circuit that generates one or more rise edge signals and one or more fall edge signals by delaying the first synchronous clock signal;
   a first clock generator that generates a first clock signal group; and
   a second clock generator that generates a second clock signal group, wherein:
   a frequency of the first clock signal group is defined and output by the first synchronous clock circuit;

rise and fall edges of the first clock signal group are defined and output by the edge signal generation circuit;

a frequency of the second clock signal group is defined and output by the second synchronous clock circuit;

rise and fall edges of the second clock signal group are defined and output by the edge signal generation circuit;

the first clock signal group drives the switched capacitor circuit;

the second clock signal group drives the chopping function unit for chopping the signal in the switched capacitor circuit; and the frequency of the first clock signal group is different from the frequency of the second clock signal group.

2. The clock signal generation circuit according to claim 1, wherein:

the edge signal generation circuit generates the one or more rise edge signals and one or more fall edge signals using one or more phase shift clock signals obtained by shifting a phase of the first synchronous clock signal by a predetermined phase amount.

3. The clock signal generation circuit according to claim 1, wherein:

the chopping function unit is arranged on an input terminal side and an output terminal side of an operational amplifier constituting the switched capacitor circuit.

4. The clock signal generation circuit according to claim 1, wherein:

the chopping function unit is arranged on an input side of an input capacitor constituting the switched capacitor circuit, both ends of a feedback capacitor of an operational amplifier constituting the switched capacitor circuit, and a latter side of an output terminal of the operational amplifier.

5. The clock signal generation circuit according to claim 1, wherein:

the chopping function unit is arranged on an input terminal side and an output terminal side of an operational amplifier constituting a reference voltage circuit for supplying a reference voltage to the switched capacitor circuit.

6. The clock signal generation circuit according to claim 1, wherein:

the second operation frequency signal is generated by dividing a frequency of the first operation frequency signal by an integer.

7. The clock signal generation circuit according to claim 1, further comprising:

a frequency division circuit that divides a frequency of an external clock signal or a frequency of a master clock signal to generate the first operation frequency signal and the second operation frequency signal.

8. A clock signal generation circuit that generates a clock signal for driving each unit with respect to a switched capacitor circuit having a chopping function unit for chopping a signal, the clock signal generation circuit comprising:

a first synchronous clock circuit that generates a first synchronous clock signal in which a first operation frequency signal is synchronized with a master clock;

a second synchronous clock circuit that generates a second synchronous clock signal in which a second operation frequency signal is synchronized with the master clock;

an edge signal generation circuit that generates one or more rise edge signals and one or more fall edge signals by delaying the second synchronous clock signal;

a first clock generator that generates a first clock signal group; and a second clock generator that generates a second clock signal group, wherein:

a frequency of the first clock signal group is defined and output by the first synchronous clock circuit;

rise and fall edges of the first clock signal group are defined and output by the edge signal generation circuit;

a frequency of the second clock signal group is defined and output by the second synchronous clock circuit;

rise and fall edges of the second clock signal group are defined and output by the edge signal generation circuit;

the first clock signal group drives the switched capacitor circuit;

the second clock signal group drives the chopping function unit for chopping the signal in the switched capacitor circuit; and the frequency of the first clock signal group is different from the frequency of the second clock signal group.

9. The clock signal generation circuit according to claim 8, wherein:

the edge signal generation circuit generates the one or more rise edge signals and one or more fall edge signals using one or more phase shift clock signals obtained by shifting a phase of the second synchronous clock signal by a predetermined phase amount.

10. The clock signal generation circuit according to claim 8, wherein:

the chopping function unit is arranged on an input terminal side and an output terminal side of an operational amplifier constituting the switched capacitor circuit.

11. The clock signal generation circuit according to claim 8, wherein:

the chopping function unit is arranged on an input side of an input capacitor constituting the switched capacitor circuit, both ends of a feedback capacitor of an operational amplifier constituting the switched capacitor circuit, and a latter side of an output terminal of the operational amplifier.

12. The clock signal generation circuit according to claim 8, wherein:

the chopping function unit is arranged on an input terminal side and an output terminal side of an operational amplifier constituting a reference voltage circuit for supplying a reference voltage to the switched capacitor circuit.

13. The clock signal generation circuit according to claim 8, wherein:

the second operation frequency signal is generated by dividing a frequency of the first operation frequency signal by an integer.

14. The clock signal generation circuit according to claim 8, further comprising:

a frequency division circuit that divides a frequency of an external clock signal or a frequency of a master clock signal to generate the first operation frequency signal and the second operation frequency signal.

\* \* \* \* \*